(12) United States Patent
Hussain et al.

(10) Patent No.: US 11,888,483 B2
(45) Date of Patent: Jan. 30, 2024

(54) CLOCK SIGNAL CONVERSION CIRCUIT FOR HIGH-SPEED SERIAL DATA CONTROLLERS

(71) Applicant: Cypress Semiconductor Corporation, San Jose, CA (US)

(72) Inventors: Wasim Hussain, Mountain View, CA (US); Nicholas Alexander Bodnaruk, Sunnyvale, CA (US); Murtuza Lilamwala, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 17/713,739

(22) Filed: Apr. 5, 2022

(65) Prior Publication Data
US 2023/0318582 A1   Oct. 5, 2023

(51) Int. Cl.
*H03K 3/017* (2006.01)
*H03H 11/04* (2006.01)
*H03F 3/45* (2006.01)

(52) U.S. Cl.
CPC ......... *H03K 3/017* (2013.01); *H03F 3/45475* (2013.01); *H03H 11/04* (2013.01)

(58) Field of Classification Search
None
See application file for complete search history.

(56) References Cited

U.S. PATENT DOCUMENTS 5,631,603 A * 5/1997 Stubbe ................ H03F 3/45744
                                            330/258
10,205,445 B1 * 2/2019 Kansal .................... H03K 7/08
(Continued)

OTHER PUBLICATIONS

Chen, Poki, et al., "A Low Power Wide Range Duty Cycle Corrector Based on Pulse Shrinking/Stretching Mechanism", IEEE Asian Solid-State Circuits Conference, Dept. of Electronic Eng. and Grad. Inst. of Electro-Optical Eng., National Taiwan University of Science and Technology Taipei, Taiwan 10617, R.O.C., Nov. 12-14, 2007, pp. 460-463.

(Continued)

*Primary Examiner* — Thomas J. Hiltunen
*Assistant Examiner* — Khareem E Almo
(74) *Attorney, Agent, or Firm* — Murphy, Bilak & Homiller, PLLC

(57) ABSTRACT

A clock signal conversion circuit includes an amplification circuit configured to amplify a differential clock signal having sub rail-to-rail voltage swings relative to a supply voltage, such that an amplified differential clock signal output by the amplification circuit has complementary positive and negative signal components with full rail-to-rail voltage swings relative to the supply voltage. A duty cycle distortion correction circuit includes: a filter having a cutoff frequency below the frequency of the differential clock signal and configured to output a differential voltage that is proportional to a difference in duty cycle between the positive and negative signal components of the amplified differential clock signal; and a transconductance amplifier configured to convert the differential voltage to a differential current that is provided to the amplification circuit as feedback for reducing the duty cycle difference between the positive and negative signal components of the amplified differential clock signal.

18 Claims, 4 Drawing Sheets

(56) References Cited

U.S. PATENT DOCUMENTS

| | | | |
|---|---|---|---|
| 2007/0046345 A1* | 3/2007 | Tai .................. | H03L 7/095 |
| | | | 327/158 |
| 2016/0087620 A1* | 3/2016 | Chakravarty ........ | H03K 5/1565 |
| | | | 327/115 |
| 2021/0152167 A1* | 5/2021 | Doppalapudi ........... | H03K 7/08 |

OTHER PUBLICATIONS

Jeong, Chan-Hui, et al., "All-Digital Duty-Cycle Corrector With a Wide Duty Correction Range for DRAM Applications", IEEE Transactions on Very Large Scale Integration (VLSI) Systems, vol. 24, No., Jan. 2016, pp. 363-367.

Lin, Chien Yu, et al., "Design of A 0.8GHz-3GHz Duty-Cycle Corrector With a 20%-80% Input Duty Cycle", 2019 IEEE International Conference on Consumer Electronics—Taiwan (ICCE-TW).

Patil, Sharath, et al., "Duty Cycle Correction Using Negative Feedback Loop", MIXDES 2009, 16th International Conference "Mixed Design of Integrated Circuits and Systems", Jun. 25-27, 2009, Poland, pp. 424-426.

Raja, Immanuel, et al., "A 0.1-3.5-GHz Duty-Cycle Measurement and Correction Technique in 130-nm CMOS", IEEE Transactions on Very Large Scale Integration (VLSI) Systems, vol. 24, No. 5, May 2016, pp. 1975-1983.

* cited by examiner

CLOCK SIGNAL CONVERSION CIRCUIT FOR HIGH-SPEED SERIAL DATA CONTROLLERS

BACKGROUND

A half-clock rate transmitter circuit for high-speed communication links typically use both rising and falling edges of the clock signal for data serialization/multiplexing and suffer from duty-cycle distortion (DCD) which results in width-reduction of the output eye diagram, decreased timing margin, and decreased maximum achievable data transmission speed. DCD results from a mismatch between rise and fall time of PMOS and NMOS devices, respectively, in a clock buffer at various corners. For example, in a ring-oscillator based PLL (phase-locked loop), the output DCD is usually poor and unpredictable. In an LC-tank VCO (voltage-controlled oscillator) based PLL, even though the VCO output has acceptable DCD, the sinusoidal output requires amplification to a full rail-to-rail swing. As a result, mismatches in the amplification stage introduce DCD at the rail-to-rail output. Transmitting a clock over a few hundreds of μm (microns) or more of routing also introduces DCD and attenuation.

Some conventional approaches perform DCD calibration in the digital domain, e.g., by using digital-to-analog conversion (DAC). However, the DAC step size limits the error correction accuracy. For example, assuming DCD ranges from 40% to 60%, a 5-bit DAC having 31 steps must cover 20% variation in DCD. That is, each step must cover about 0.66% DCD variation. That implies the target accuracy will be no less than 0.66% even if everything else is perfectly symmetric. Accordingly, calibration accuracy decreases if the range is increased. Furthermore, the inaccuracy adds to the offset-error associated with the sensing mechanism. One way to increase accuracy is to use higher-bit DAC which makes the system more complex and power consuming.

Conventional DCD correction solutions are designed for full or near full swing CMOS (Complementary Metal Oxide Semiconductor) clock input but not sub rail-to-rail logic such as CML (current mode logic). Also, conventional DCD correction solutions consume a high amount of power. For example, 50% duty-cycle may be obtained by generating 2× frequency and then using a divide-by-2 block. However, this implies about 2× power consumption by the VCO. Moreover, sending the resulting clock over a long distance of a few hundreds of μm of routing causes significant attenuation which results in an unpredictable duty cycle at the receiving end.

Thus, there is a need for an improved half-clock rate transmitter circuit for use in high-speed communication links.

SUMMARY

According to an embodiment of a clock signal conversion circuit, the clock signal conversion circuit comprises: an amplification circuit configured to amplify a differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; a duty cycle distortion correction circuit comprising: a filter having a cutoff frequency below the frequency of the differential clock signal and configured to output a differential voltage that is proportional to a difference in duty cycle between the positive and negative signal components of the amplified differential clock signal; and a transconductance amplifier configured to convert the differential voltage to a differential current that is provided to the amplification circuit as feedback for reducing the duty cycle difference between the positive and negative signal components of the amplified differential clock signal.

According to an embodiment of a Universal Serial Bus (USB) integrated circuit (IC) controller, the USB IC controller comprises: a clock generation circuit configured to generate a differential clock signal; and a physical layer circuit comprising: an amplification circuit configured to amplify the differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and a duty cycle distortion correction circuit comprising: a filter having a cutoff frequency below the frequency of the differential clock signal and configured to output a differential voltage that is proportional to a difference in duty cycle between the positive and negative signal components of the amplified differential clock signal; and a transconductance amplifier configured to convert the differential voltage to a differential current that is provided to the amplification circuit as feedback for reducing the duty cycle difference between the positive and negative signal components of the amplified differential clock signal.

According to another embodiment of a clock signal conversion circuit, the clock signal conversion circuit comprises: an amplification circuit configured to amplify a differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and a duty cycle distortion correction circuit comprising: a filter having a cutoff frequency below the frequency of the differential clock signal and configured to output a differential voltage that is proportional to a difference in duty cycle between the positive and negative signal components of the amplified differential clock signal; a transconductance amplifier configured to convert the differential voltage to a differential current that is provided to the amplification circuit as feedback for reducing the duty cycle difference between the positive and negative signal components of the amplified differential clock signal; and a common-mode loop configured to force the average of a positive side of the differential voltage and a negative side of the differential voltage to half a mid-rail voltage reference input to the common-mode loop.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a clock signal conversion circuit that may be used, e.g., with a Universal Serial Bus (USB) integrated circuit (IC) controller. The clock signal conversion circuit senses duty-cycle distortion (DCD), e.g., using a low pass filter (LPF). The clock signal conversion circuit generates an error signal based on the sensed duty-cycle distortion, e.g., in the form of a proportional current. The clock signal conversion circuit uses the error signal to correct/reduce the duty-cycle distortion. If current is used as the error signal, the duty-cycle distortion correction scheme described herein is aptly suited for input CML clock signals.

The clock signal conversion circuit described herein may be used in low, mid, and/or high-speed clock generation systems where the PLL/VCO output has poor DCD. For example, a PLL with a ring oscillator typically has poor DCD but is power and die-area efficient and has a wide tuning range. The clock signal conversion circuit described herein may be used to calibrate the duty cycle of the ring oscillator and generate 50% duty-cycle over a wide frequency range. The clock signal conversion circuit described herein may be designed for partial/attenuated swing or CML clock inputs and may consume less than 100 uA.

Described next, with reference to the figures, are exemplary embodiments of the clock signal conversion circuit and related methods of operation.

Figure 1:
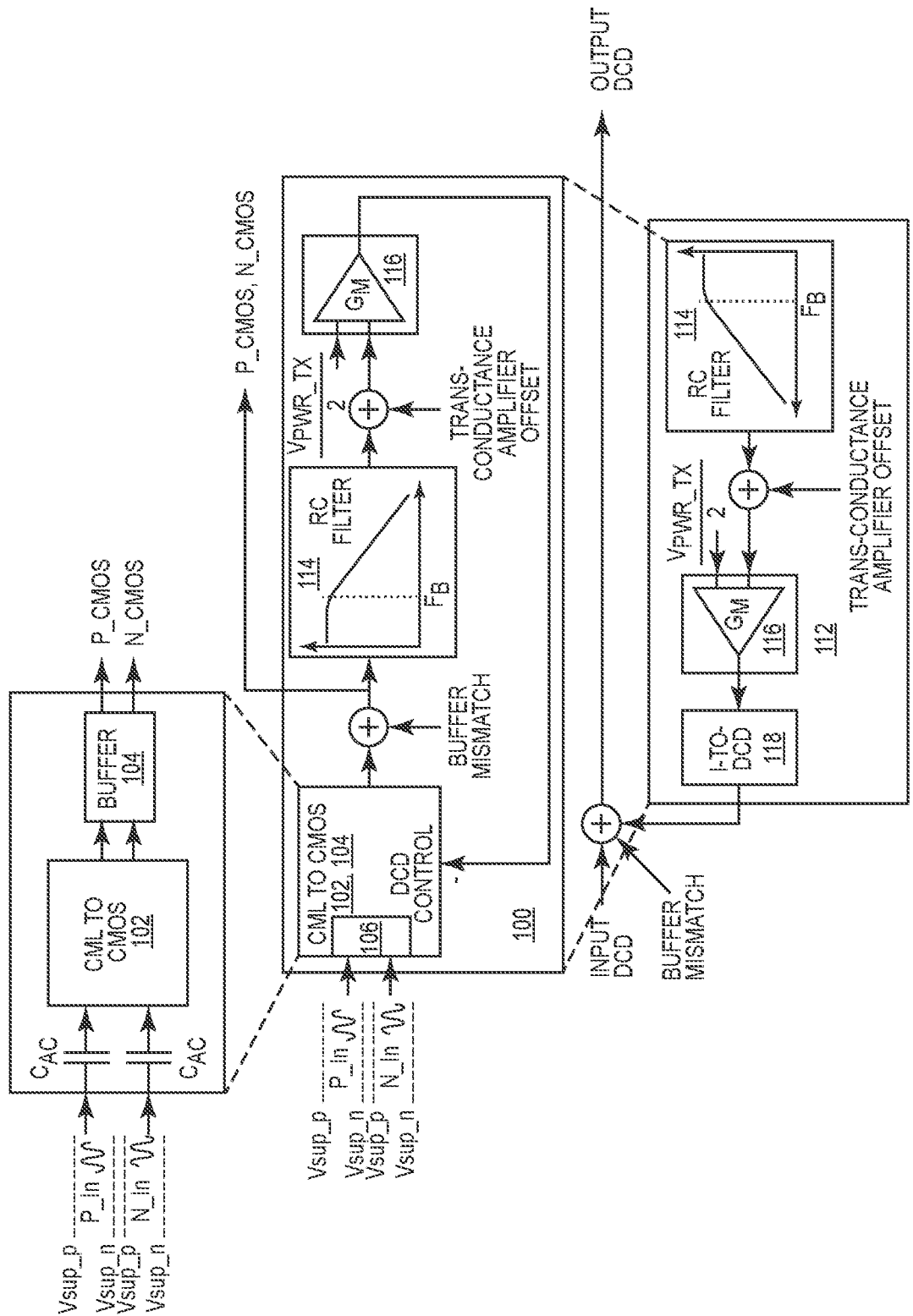
FIG. 1 illustrates a block diagram of an embodiment of a clock signal conversion circuit.

FIG. 1 illustrates an embodiment of a clock signal conversion circuit 100, with different levels of detail. The clock signal conversion circuit 100 is illustrated and explained in the context of CML as the clock logic type, as an example. CML refers to a logic family that uses transistors as drivers that route current. CML operates within the active region of the transistors such that the transistors do not operate in cut-off when producing a logic one or saturate when producing a logic zero. Accordingly, the differential CML clock signal has sub rail-to-rail voltage swings. This allows the driver switching speed to be much faster than a driver that switches in and out of a saturated state. Bias currents sent to the driving transistors to switch the device on and off gave rise to the term 'current mode'. Other clock logic types may be used such as LVPECL (low-voltage positive/pseudo emitter-coupled logic), HCSL (high speed current steering logic), LVDS (low-voltage differential signaling), VML (voltage-mode logic), etc. and that operate with a different common-mode voltage. In each case, the clock signal conversion circuit 100 includes translation logic 102 and a buffer 104 for transferring a CML-based or other clock logic type differential clock input signal 'P_In, N_In' to a CMOS compatible differential voltage 'P_CMOS, N_CMOS' having constant high and low voltage levels but with duty cycle correction.

Figure 2:
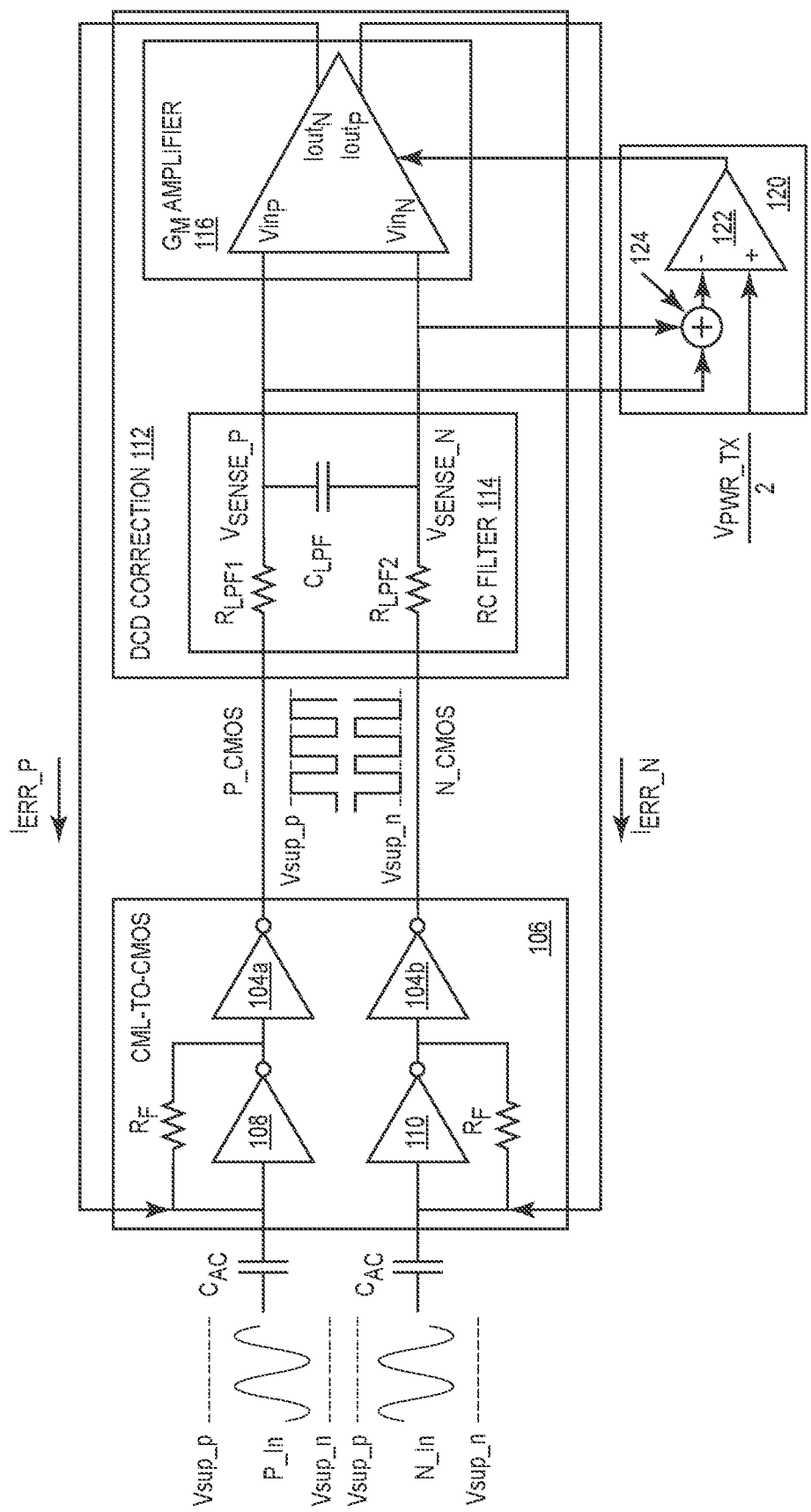
FIG. 2 illustrates a circuit diagram of another embodiment of the clock signal conversion circuit.

The translation logic 102 includes an amplification circuit 106 for amplifying the differential clock input signal P_In, N_In which has sub rail-to-rail voltage swings relative to the supply voltage 'Vsup_p, Vsup_n' for the amplification circuit 106. The amplified differential clock signal output by the amplification circuit 106 has complementary positive and negative signal components P_CMOS, N_CMOS each with full rail-to-rail voltage swings relative to the supply voltage Vsup_p, Vsup_n, e.g., as shown in FIG. 2. In one embodiment, the supply voltage Vsup_p, Vsup_n for the amplification circuit 106 is 1V or higher and the positive and negative signal components P_In, N_In of the differential clock signal input to the amplification circuit 106 both have voltage swings in a range of 100 to 500 mV.

The amplification circuit 106 amplifies the relatively weak incoming differential clock input signal P_In, N_In, but may worsen (increase) the duty cycle distortion already present in the incoming differential clock input signal P_In, N_In. For example, NMOS and/or PMOS devices may be included in respective inverters 108, 110 of the amplification circuit 106 and may not be the same strength in both branches which gives rise to different rise and/or fall times. Other sources of mismatch may be present in the amplification circuit 106. The mismatch is indicated by the label 'Buffer Mismatch' in FIG. 1 to indicate that any mismatch present in the amplification circuit 106 may add to the duty cycle distortion already present in the incoming differential clock input signal P_In, N_In.

The clock signal conversion circuit 100 also includes a duty cycle distortion (DCD) correction circuit 112 for reducing or even eliminating duty cycle distortion from the differential output P_CMOS, N_CMOS of the amplification circuit 106. To this end, the DCD correction circuit 112 includes a filter 114 and a transconductance ('$G_M$') amplifier 116.

The filter 114 of the DCD correction circuit 112 has a cutoff frequency '$F_B$' below the frequency of the differential clock signal P_In, N_In input to the amplification circuit 106 and outputs a differential (error) voltage '$V_{SENSE\_P}$, $V_{SENSE\_N}$' that is proportional to a difference in duty cycle between the positive and negative signal components P_CMOS, N_CMOS of the amplified differential clock signal, e.g., as shown in FIG. 2. The cutoff frequency $F_B$ of the filter 114 is selected to ensure stability. If $F_B$ is too high, then the loop may not be stable. If $F_B$ is too low, then the system will be stable but unnecessarily slow. In one embodiment, the cutoff frequency $F_B$ of the filter 114 is in a range of 100 to 200 times lower than the frequency of the differential clock signal P_In, N_In input to the amplification circuit 106. For example, the differential clock signal frequency may be 5 Ghz and $F_B$ may be 20 Mhz.

According to the embodiment illustrated in FIG. 2, the filter 114 of the DCD correction circuit 112 is an RC low pass filter that includes a capacitor $C_{LPF}$, a first resistor $R_{LPF1}$ coupling a first terminal of the capacitor $C_{LPF}$ to a first buffer 104a of the amplification circuit 106 that outputs the positive signal component P_CMOS of the amplified differential clock signal, and a second resistor $R_{LPF2}$ coupling a second terminal of the capacitor $C_{LPF}$ to a second buffer 104b of the amplification circuit 106 that outputs the negative signal component N_CMOS of the amplified differential clock signal.

In one embodiment, the differential error voltage $V_{SENSE\_P}$, $V_{SENSE\_N}$ output by the filter 114 is directly applied to the transconductance amplifier 116. For example, a first input terminal $Vin_P$ of the transconductance amplifier 116 may be electrically coupled to the terminal of the filter capacitor $C_{LPF}$ at the positive side $V_{SENSE\_P}$ of the differential filter output voltage. A second input terminal $Vin_N$ of the transconductance amplifier 116 may be electrically coupled to the terminal of the filter capacitor $C_{LPF}$ at the negative side $V_{SENSE\_N}$ of the differential filter output voltage. A first output terminal $Iout_P$ of the transconductance amplifier 116 may be electrically coupled to the input terminal of the amplification circuit 106 that receives the positive signal component N_In of the incoming differential clock signal. A second output terminal Iout$_N$ of the transconductance amplifier 116 may be electrically coupled to the input terminal of the amplification circuit 106 that receives the negative signal component P_In of the incoming differential clock signal. Coupling Iout$_P$ to an input terminal that receives N_In and coupling Iout$_N$ to an input terminal that receives P_In results in applying Iout$_P$ and Iout$_N$ in a negative feedback manner.

The transconductance amplifier 116 may inject an undesired offset into the differential error voltage V$_{SENSE\_P}$, V$_{SENSE\_N}$, e.g., due to device mismatch, etc. The offset introduced by the transconductance amplifier 116 is indicated by the label 'Transconductance Amplifier Offset' in FIG. 1 to indicate that any offset introduced by the transconductance amplifier 116 may add to the duty cycle distortion already present in the incoming differential clock input signal P_In, N_In.

The transconductance amplifier 116 converts the differential error voltage V$_{SENSE\_P}$, V$_{SENSE\_N}$ to a differential error current 'I$_{ERR\_P}$, I$_{ERR\_N}$' that is provided to the amplification circuit 106 as negative feedback. More particularly, the positive component I$_{ERR\_P}$ of the differential error current is fed back to the negative signal component N_In of the differential clock signal input to the amplification circuit 106 and the negative component I$_{ERR\_N}$ of the differential error current is fed back to the positive signal component P_In of the differential clock signal input to the amplification circuit 106.

The differential current feedback I$_{ERR\_P}$, I$_{ERR\_N}$ is used as an error signal to reduce the duty cycle difference between the positive and negative signal components P_CMOS, N_CMOS of the amplified differential clock signal output by the amplification circuit 106. Applying current as an error signal provides better control and linearity as compared to using a switch. Also, high clock switching frequencies can be supported, e.g., 5 Gbps, 10 Gbps or even 20 Gbps or higher incoming clock signal may be used.

The duty cycle distortion correction process implemented by the DCD correction circuit 112 is a continuous one. For example, the error signal changes approximately within 0.1 to 0.3 µs, if there is any change in the duty cycle distortion present in the incoming differential clock input signal P_In, N_In. While the DCD correction process is illustrated in FIGS. 1 and 2 as being based on a differential error current feedback I$_{ERR\_P}$, I$_{ERR\_N}$, any type of signal which gives a measure of duty cycle distortion for the incoming differential clock input signal P_In, N_In may be used. For example, the error signal fed back by the DCD correction circuit 112 to the differential input of the amplification circuit 106 may be based on voltage, current, force, displacement, etc.

The bottom schematic in FIG. 1 illustrates the effect of the error signal feedback provided by the DCD correction circuit 112 on the amplified differential clock signal output by the amplification circuit 106. The differential error current signal I$_{ERR\_P}$, I$_{ERR\_N}$ output by the transconductance amplifier 116 is fed back to the amplification circuit 106 as a DCD error signal 118 by the DCD correction circuit 112. The relationship between injected current at the input of the amplifier inverters 108, 110 with resistive feedback and change in output duty-cycle is highly linear across PVT (process, voltage, and temperature). The relationship between output voltage and input duty-cycle is also highly precise and linear across PVT for the low pass filter 114. If the transconductance amplifier 116 has little variation across PVT, an overall loop-gain with small variation across PVT can be realized which ensures a stable loop with sufficiently high loop gain.

Accordingly, the DCD error signal provided by the DCD correction circuit 112 partly or completely offsets or cancels both the duty cycle distortion ('Input DCD') present in the incoming differential clock input signal P_In, N_In and the duty cycle distortion ('Buffer Mismatch') contributed by the amplification circuit 106, e.g., due to device mismatch. The result ('Output DCD') of the error signal feedback is no or significantly reduced duty cycle distortion present in the complementary positive and negative signal components P_CMOS, N_CMOS of the amplified differential clock signal output by the amplification circuit 106.

In some cases, both signal components P_CMOS, N_CMOS of the amplified differential clock signal may have the same duty cycle but not 50%, e.g., 52%. For example, the inverters 108, 110 of the amplification circuit 106 may have process variation such that one transition (rising or falling) is different than the other and which leads to a duty cycle other than 50%. If this is a concern for a particular application, the DCD correction circuit 112 may include a common-mode loop 120 that forces the average duty cycle of both the positive and negative signal components P_CMOS, N_CMOS of the amplified differential clock signal to 50%.

The common mode loop 120 shown in FIG. 2 ensures that the summation of both duty cycles equals 100%. The inverters 108, 110 of the amplification circuit 106 are powered by a power supply 'V$_{PWR\_TX}$'. A resistor divider (not shown) may generate a midpoint voltage $$\frac{V_{PWR\_TX}}{2}$$

from the inverter power supply voltage V$_{PWR\_TX}$. The midpoint voltage $$\frac{V_{PWR\_TX}}{2}$$

is input to the positive '+' input terminal of an amplifier 122 of the common mode loop 120. The positive and negative signal components P_CMOS, N_CMOS of the amplified differential clock signal are combined by a signal combiner 124 and input to the negative '−' input terminal of the common mode loop amplifier 122. Even if V$_{PWR\_TX}$ has variation, the reference point $$\frac{V_{PWR\_TX}}{2}$$

for the common mode loop amplifier 122 is always at the midpoint. Accordingly, the combination of the differential loop and the common mode loop implemented by the DCD correction circuit 112 ensures that the duty cycles of both signal components P_CMOS, N_CMOS of the amplified differential clock signal are equal.

Figure 3:
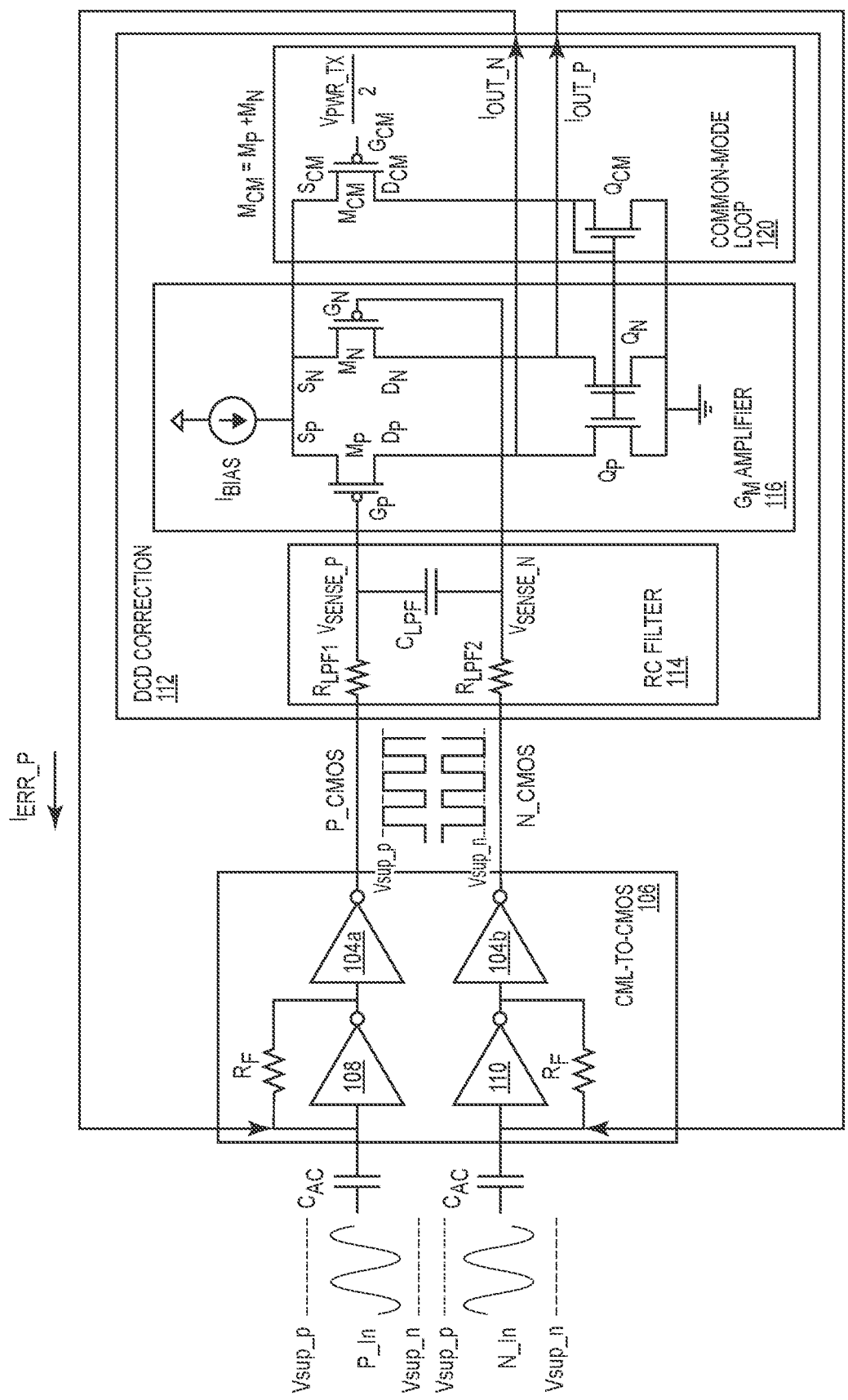
FIG. 3 illustrates a circuit diagram of another embodiment of the clock signal conversion circuit.

FIG. 3 illustrates an embodiment of the transconductance amplifier 116 and the common mode loop 120 of the DCD correction circuit 112. According to this embodiment, the transconductance amplifier 116 includes a first PMOS transistor M$_P$ having a gate GP driven by the positive side $V_{SENSE\_P}$ of the differential voltage output by the filter 114 and a second PMOS transistor $M_N$ having a gate $G_N$ driven by a negative side $V_{SENSE\_N}$ of the differential voltage output by the filter 114. PMOS transistors $M_P$ and $M_N$ have the same strength.

The drain $D_P$ of the first PMOS transistor $M_P$ is coupled to the input terminal of the amplification circuit 106 that receives the negative signal component N_In of the incoming differential clock signal. The drain $D_N$ of the second PMOS transistor $M_N$ is coupled to the input terminal of the amplification circuit 106 that receives the positive signal component P_In of the incoming differential clock signal. The drains $D_P$, $D_N$ of the PMOS transistors $M_P$, $M_N$ are also coupled to respective (low-side) NMOS transistors $Q_P$, $Q_N$ to form the transconductance amplifier 116. The sources $S_P$, $S_N$ of the PMOS transistors $M_P$, $M_N$ are coupled to a current bias '$I_{BIAS}$'.

The PMOS transistors $M_P$, $M_N$ form the transconductance amplifier 116 that generates the differential error current $I_{ERR\_N}$, $I_{ERR\_P}$. The differential error current $I_{ERR\_N}$, $I_{ERR\_P}$ is injected into the input of amplification circuit inverters 108, 110 and forces the average of the positive side $V_{SENSE\_P}$ of the differential voltage and the negative side positive side $V_{SENSE\_N}$ of the differential voltage output by the filter 114 to be equal. This ensures that the duty cycles of the positive signal component P_CMOS and negative signal component N_CMOS of the amplified differential clock signal are the same.

The common mode loop 120 of the DCD correction circuit 112 includes a PMOS transistor $M_{CM}$ having a gate $G_{CM}$ driven by the mid-rail voltage reference $$\frac{V_{PWR\_TX}}{2}.$$

The source $S_{CM}$ of the PMOS transistor $M_{CM}$ is coupled to the current bias '$I_{BIAS}$'. The drain $D_{CM}$ of the PMOS transistor $M_{CM}$ is coupled to a corresponding (low-side) NMOS transistor $Q_{CM}$ to form the common mode loop 120. PMOS transistor $M_{CM}$ forms the common-mode loop 120 with PMOS transistors $M_P$ and $M_N$ of the transconductance amplifier 116.

The common-mode loop 120 forces the average of $V_{SENSE\_P}$ and $V_{SENSE\_N}$ to half the mid-rail voltage reference $$\frac{V_{PWR\_TX}}{2}.$$

Accordingly, even if the positive signal components of P_CMOS and N_CMOS are equal to each other but greater than $$\frac{V_{PWR\_TX}}{2},$$

i.e., the duty cycle of both signal components is above 50%, PMOS transistors $M_P$ and $M_N$ turn off more than PMOS transistor $M_{CM}$ and less bias current is injected into nodes $I_{OUT\_P}$ and $I_{OUT\_N}$ such that the duty cycles of both P_CMOS and N_CMOS of the amplified differential clock signal eventually reach 50% individually.

Two important metrics of a negative feedback loop are loop-gain and stability. The clock signal conversion circuit described herein uses a negative feedback loop which can be robustly characterized in terms of loop-gain and stability via simulation. The negative feedback loop can be recharacterized if the operating conditions such as input clock frequency, power supply, etc. is changed to a different CMOS technology node. Accordingly, the clock signal conversion circuit described herein can be readily adapted to different applications.

For example, in the case of an input CML clock being applied to an AC-coupled inverter with resistive feedback followed by a regular inverter, the cutoff frequency of a filter may be set significantly lower than the clock frequency. The filter produces a differential voltage that is proportional to the duty cycle difference between the signal components of the amplified clock signal. A transconductance amplifier generates an error current that is injected at the amplifier inverter inputs to force the duty-cycle of the differential clock signal components to be equal. A common-mode loop with a mid-rail reference may be used in conjunction with the transconductance amplifier to ensure that the average duty cycle of the signal components of the differential clock signal is 50%.

The DCD correction technique described herein is implemented as a negative feedback loop and simulations have shown the DCD correction technique to be robust in terms of loop-gain and stability. The DCD correction technique can be readily re-characterized if an operation condition such as input clock frequency, power supply, etc. is changed or for a different CMOS technology node, etc. Accordingly, while the DCD correction technique described herein has been applied to a clock signal conversion circuit that converts a partial swing clock signal to a full-swing rail-to-rail clock signal with reduced duty cycle distortion, the DCD correction technique also may be applied to the receive end of any system that transmits a clock signal over some distance and where the clock signal becomes attenuated.

Figure 4:
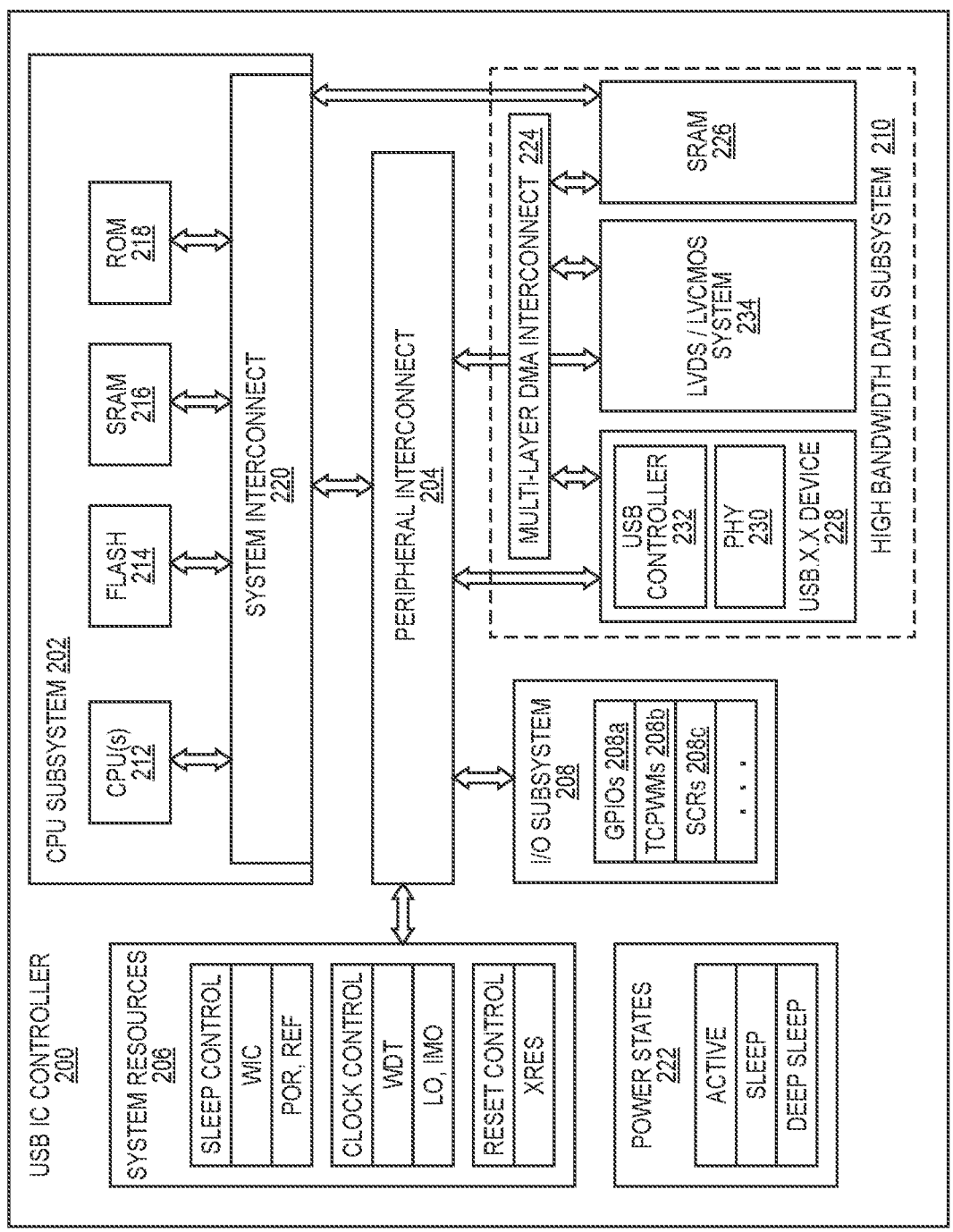
FIG. 4 illustrates a block diagram of an embodiment of a USB integrated circuit (IC) controller that includes the clock signal conversion circuit.

FIG. 4 illustrates an embodiment of a Universal Serial Bus (USB) integrated circuit (10) controller 200 such as a USB 3.1/3.2 high-speed data controller. The USB IC controller 200 may be implemented as a single-chip IC controller manufactured on a semiconductor die. In another example, the USB IC controller 200 may be a single-chip IC that is manufactured as a System-on-Chip (SoC). In other embodiments, the USB IC controller 200 may be a multi-chip module encapsulated in a single semiconductor package.

The USB IC controller 200 includes a CPU (Central Processing Unit) subsystem 202, a peripheral interconnect 204, system resources 206, an input/output (I/O) subsystem 208, a high bandwidth data subsystem 210, and various terminals (e.g., pins) that are configured for receiving and sending signals.

The CPU subsystem 202 may include one or more CPUs 212, flash memory 214, SRAM (Static Random Access Memory) 216, ROM (Read Only Memory) 218, etc. that are coupled to system interconnect 220. Each CPU 212 is a suitable processor that can operate in an IC or a SoC device. The flash memory 214 is non-volatile memory (e.g., NAND flash, NOR flash, etc.) that is configured for storing data, programs, and/or other firmware instructions. The flash memory 214 is tightly coupled within the CPU subsystem 202 for improved access times. The SRAM 216 is volatile memory that is configured for storing data and firmware instructions accessed by each CPU 212. The ROM 218 is read-only memory (or other suitable storage medium) that is configured for storing boot-up routines, configuration parameters, and other firmware parameters and settings. The system interconnect 220 is a system bus (e.g., a single-level or multi-level Advanced High-Performance Bus, or AHB) that is configured as an interface that couples the various components of the CPU subsystem 202 to each other, as well as a data and control interface between the various components of the CPU subsystem 202 and the peripheral interconnect 204.

The peripheral interconnect 204 is a peripheral bus (e.g., a single-level or multi-level AHB) that provides the primary data and control interface between the CPU subsystem 202 and its peripherals and other resources, such as the system resources 206, the I/O subsystem 208, and the high bandwidth data subsystem 210. The peripheral interconnect 204 may include various controller circuits (e.g., direct memory access, or DMA controllers), which may be programmed to transfer data between peripheral blocks without burdening the CPU subsystem 202. In various embodiments, each of the components of the CPU subsystem 202 and the peripheral interconnect 204 may be different with each choice or type of CPU, system bus, and/or peripheral bus.

The system resources 206 include various electronic circuits that support the operation of the USB IC controller 200 in its various states and modes. For example, the system resources 206 may include a power subsystem having analog and/or digital circuits required for each controller state/mode such as, for example, sleep control circuits, wake-up interrupt controller (WIC), power-on-reset (POR), voltage and/or current reference (REF) circuits, etc. In some embodiments, the power subsystem may also include circuits that allow the USB IC controller 200 to draw and/or provide power from/to external sources with several different voltage and/or current levels and to support controller operation in several power states 222 (e.g., such as active state, sleep state, and a deep sleep state with clocks turned off). Further, in some embodiments the CPU subsystem 202 may be optimized for low-power operation with extensive clock gating and may include various internal controller circuits that allow the CPU subsystem 202 to operate in the various power states 222. For example, the CPU subsystem 202 may include a wake-up interrupt controller that is configured to wake the CPU subsystem 202 from a sleep state, thereby allowing power to be switched off when the IC chip is in the sleep state. The system resources 206 may also include a clock subsystem having analog and/or digital circuits for clock generation and clock management such as, for example, clock control circuits, watchdog timer (WDT) circuit(s), internal low-speed oscillator (ILO) circuit(s), and internal main oscillator (IMO) circuit(s), etc. The system resources 206 may also include analog and/or digital circuit blocks that provide reset control and support external reset (XRES).

The I/O subsystem 208 includes several different types of I/O blocks and subsystems. For example, the I/O subsystem 208 includes GPIO (general purpose input output) blocks 208a, TCPWM (timer/counter/pulse-width-modulation) blocks 208b, and SCBs (serial communication blocks) 208c. The GPIOs 208a include analog and/or digital circuits configured to implement various functions such as, for example, pull-ups, pull-downs, input threshold select, input and output buffer enabling/disabling, multiplex signals connected to various I/O pins, etc. The TCPWMs 208b include analog and/or digital circuits configured to implement timers, counters, pulse-width modulators, decoders and various other analog/mixed signal elements that are configured to operate on input/output signals. The SCBs 208c include analog and/or digital circuits configured to implement various serial communication interfaces such as, for example, I2C, SPI (serial peripheral interface), UART (universal asynchronous receiver/transmitter), CAN (Controller Area Network) interface, CXPI (Clock eXtension Peripheral Interface), etc.

The high bandwidth data subsystem 210 provides DMA (direct memory access) data transfers from LVDS (low-voltage differential signalling)/LVCMOS (low-voltage CMOS) input to USB output at speeds up to 10 Gbps for USB 3.2 Gen 2, 20 Gbps for USB 3.2 Gen 2×2 transfer rates, 40 Gbps for USB 4, etc. The high bandwidth data subsystem 210 includes a multi-layer DMA interconnect 224, SRAM 226 for buffering USB data, a USB device 228 that includes one or more USB PHY (physical interface) 230 for implementing USB 2.X, 3.X, 4.X, etc. endpoints with transmission speeds of 480 Mbps, 5 Gbps, 10 Gbps, 20 Gbps, 40 Gbps, etc., one or more USB controllers 232 and related circuitry, and an LVDS/LVCMOS subsystem 234 for providing an LVDS/LVCMOS interface.

In accordance with the DCD correction technique described herein, the USB PHY 230 included in the high bandwidth data subsystem 210 includes the clock signal conversion circuit 100 described herein. The clock subsystem included in the system resources 206 generates a differential clock signal of the kind described herein and used by the USB PHY 230. The amplification circuit 106 of the clock signal conversion circuit 100 amplifies the differential clock signal and the duty cycle distortion correction circuit 112 of the clock signal conversion circuit 100 reduces or eliminates duty-cycle distortion present in the differential clock signal when received at the USB PHY 230, as described herein.

In FIG. 4, clock signal conversion circuit 100 is included in the USB PHY 230. However, the clock signal conversion circuit 100 may be used in other standards such as LVDS, VML, etc.

Although the present disclosure is not so limited, the following numbered examples demonstrate one or more aspects of the disclosure.

Example 1. A clock signal conversion circuit, comprising: an amplification circuit configured to amplify a differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and a duty cycle distortion correction circuit comprising: a filter having a cutoff frequency below the frequency of the differential clock signal and configured to output a differential voltage that is proportional to a difference in duty cycle between the positive and negative signal components of the amplified differential clock signal; and a transconductance amplifier configured to convert the differential voltage to a differential current that is provided to the amplification circuit as feedback for reducing the duty cycle difference between the positive and negative signal components of the amplified differential clock signal.

Example 2. The clock signal conversion circuit of example 1, wherein the cutoff frequency of the filter is in a range of 100 to 200 times lower than the frequency of the differential clock signal.

Example 3. The clock signal conversion circuit of example 1 or 2, wherein the supply voltage for the amplification circuit is 1V or higher, and wherein the positive and negative signal components of the differential clock signal both have voltage swings in a range of 100 to 500 mV as input to the amplification circuit.

Example 4. The clock signal conversion circuit of any of examples 1 through 3, wherein the duty cycle distortion correction circuit further comprises a common-mode loop configured to force an average duty cycle of both the positive and negative signal components of the amplified differential clock signal to 50%.

Example 5. The clock signal conversion circuit of any of examples 1 through 4, wherein the filter comprises: a capacitor; a first resistor coupling a first terminal of the capacitor to a first buffer of the amplification circuit that outputs the positive signal component of the amplified differential clock signal; and a second resistor coupling a second terminal of the capacitor to a second buffer of the amplification circuit that outputs the negative signal component of the amplified differential clock signal.

Example 6. The clock signal conversion circuit of example 5, wherein the transconductance amplifier comprises: a first input terminal coupled to the first terminal of the capacitor of the filter; a second input terminal coupled to the second terminal of the capacitor of the filter; a first output terminal coupled to a first input terminal of the amplification circuit that receives the positive signal component of the differential clock signal; and a second output terminal coupled to a second input terminal of the amplification circuit that receives the negative signal component of the differential clock signal.

Example 7. The clock signal conversion circuit of any of examples 1 through 6, wherein the transconductance amplifier comprises: a first PMOS transistor having a gate driven by a positive side of the differential voltage output by the filter; and a second PMOS transistor having a gate driven by a negative side of the differential voltage output by the filter.

Example 8. The clock signal conversion circuit of example 7, wherein a drain of the first PMOS transistor is coupled to a first input terminal of the amplification circuit that receives the positive signal component of the differential clock signal, and wherein a drain of the second PMOS transistor is coupled to a second input terminal of the amplification circuit that receives the negative signal component of the differential clock signal.

Example 9. The clock signal conversion circuit of example 7 or 8, wherein the duty cycle distortion correction circuit further comprises a common-mode loop comprising a PMOS transistor having a gate driven by a mid-rail voltage reference, and wherein the common-mode loop is configured to force the average of a positive side of the differential voltage and a negative side of the differential voltage to half the mid-rail voltage reference.

Example 10. A Universal Serial Bus (USB) integrated circuit (IC) controller, the USB IC controller comprising: a clock generation circuit configured to generate a differential clock signal; and a physical layer circuit comprising: an amplification circuit configured to amplify the differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and a duty cycle distortion correction circuit comprising: a filter having a cutoff frequency below the frequency of the differential clock signal and configured to output a differential voltage that is proportional to a difference in duty cycle between the positive and negative signal components of the amplified differential clock signal; and a transconductance amplifier configured to convert the differential voltage to a differential current that is provided to the amplification circuit as feedback for reducing the duty cycle difference between the positive and negative signal components of the amplified differential clock signal.

Example 11. The USB IC controller of example 10, wherein the cutoff frequency of the filter is in a range of 100 to 200 times lower than the frequency of the differential clock signal.

Example 12. The USB IC controller of example 10 or 11, wherein the supply voltage for the amplification circuit is 1V or higher, and wherein the positive and negative signal components of the differential clock signal both have voltage swings in a range of 100 to 500 mV as input to the amplification circuit.

Example 13. The USB IC controller of any of examples 10 through 12, wherein the duty cycle distortion correction circuit further comprises a common-mode loop configured to force an average duty cycle of both the positive and negative signal components of the amplified differential clock signal to 50%.

Example 14. The USB IC controller of any of examples 10 through 13, wherein the filter comprises: a capacitor; a first resistor coupling a first terminal of the capacitor to a first buffer of the amplification circuit that outputs the positive signal component of the amplified differential clock signal; and a second resistor coupling a second terminal of the capacitor to a second buffer of the amplification circuit that outputs the negative signal component of the amplified differential clock signal.

Example 15. The USB IC controller of example 14, wherein the transconductance amplifier comprises: a first input terminal coupled to the first terminal of the capacitor of the filter; a second input terminal coupled to the second terminal of the capacitor of the filter; a first output terminal coupled to a first input terminal of the amplification circuit that receives the positive signal component of the differential clock signal; and a second output terminal coupled to a second input terminal of the amplification circuit that receives the negative signal component of the differential clock signal.

Example 16. The USB IC controller of any of examples 10 through 15, wherein the transconductance amplifier comprises: a first PMOS transistor having a gate driven by a positive side of the differential voltage output by the filter; and a second PMOS transistor having a gate driven by a negative side of the differential voltage output by the filter.

Example 17. The USB IC controller of example 16, wherein a drain of the first PMOS transistor is coupled to a first input terminal of the amplification circuit that receives the positive signal component of the differential clock signal, and wherein a drain of the second PMOS transistor is coupled to a second input terminal of the amplification circuit that receives the negative signal component of the differential clock signal.

Example 18. The USB IC controller of example 16 or 17, wherein the duty cycle distortion correction circuit further comprises a common-mode loop comprising a PMOS transistor having a gate driven by a mid-rail voltage reference, and wherein the common-mode loop is configured to force the average of a positive side of the differential voltage and a negative side of the differential voltage to half the mid-rail voltage reference.

Example 19. A clock signal conversion circuit, comprising: an amplification circuit configured to amplify a differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and a duty cycle distortion correction circuit comprising: a filter having a cutoff frequency below the frequency of the differential clock signal and configured to output a differential voltage that is proportional to a difference in duty cycle between the positive and negative signal components of the amplified differential clock signal; a transconductance amplifier configured to convert the differential voltage to a differential current that is provided to the amplification circuit as feedback for reducing the duty cycle difference between the positive and negative signal components of the amplified differential clock signal; and a common-mode loop configured to force the average of a positive side of the differential voltage and a negative side of the differential voltage to half a mid-rail voltage reference input to the common-mode loop.

Example 20. The clock signal conversion circuit of example 19, wherein the transconductance amplifier comprises a first PMOS transistor having a gate driven by a positive side of the differential voltage output by the filter and a second PMOS transistor having a gate driven by a negative side of the differential voltage output by the filter, and wherein the common-mode loop comprises a PMOS transistor having a gate driven by the mid-rail voltage reference input to the common-mode loop.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A clock signal conversion circuit, comprising:
    an amplification circuit configured to amplify a differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and
    a duty cycle distortion correction circuit comprising:
        a filter having a cutoff frequency below the frequency of the differential clock signal and configured to output a differential voltage that is proportional to a difference in duty cycle between the positive and negative signal components of the amplified differential clock signal;
        a transconductance amplifier configured to convert the differential voltage to a differential current that is provided to the amplification circuit as feedback for reducing the duty cycle difference between the positive and negative signal components of the amplified differential clock signal; and
        a common-mode loop comprising a PMOS transistor having a gate driven by a mid-rail voltage reference, wherein the common-mode loop is configured to force the average of a positive side of the differential voltage and a negative side of the differential voltage to half the mid-rail voltage reference.

2. The clock signal conversion circuit of claim 1, wherein the cutoff frequency of the filter is in a range of 100 to 200 times lower than the frequency of the differential clock signal.

3. The clock signal conversion circuit of claim 1, wherein the supply voltage for the amplification circuit is 1V or higher, and wherein the positive and negative signal components of the differential clock signal both have voltage swings in a range of 100 to 500 mV as input to the amplification circuit.

4. The clock signal conversion circuit of claim 1, wherein the duty cycle distortion correction circuit further comprises a common-mode loop configured to force an average duty cycle of both the positive and negative signal components of the amplified differential clock signal to 50%.

5. The clock signal conversion circuit of claim 1, wherein the filter comprises:
    a capacitor;
    a first resistor coupling a first terminal of the capacitor to a first buffer of the amplification circuit that outputs the positive signal component of the amplified differential clock signal; and
    a second resistor coupling a second terminal of the capacitor to a second buffer of the amplification circuit that outputs the negative signal component of the amplified differential clock signal.

6. The clock signal conversion circuit of claim 5, wherein the transconductance amplifier comprises:
    a first input terminal coupled to the first terminal of the capacitor of the filter;
    a second input terminal coupled to the second terminal of the capacitor of the filter;
    a first output terminal coupled to a first input terminal of the amplification circuit that receives the positive signal component of the differential clock signal; and
    a second output terminal coupled to a second input terminal of the amplification circuit that receives the negative signal component of the differential clock signal.

7. The clock signal conversion circuit of claim 1, wherein the transconductance amplifier comprises:
    a first PMOS transistor having a gate driven by the positive side of the differential voltage output by the filter; and
    a second PMOS transistor having a gate driven by the negative side of the differential voltage output by the filter.

8. The clock signal conversion circuit of claim 7, wherein a drain of the first PMOS transistor is coupled to a first input terminal of the amplification circuit that receives the positive signal component of the differential clock signal, and wherein a drain of the second PMOS transistor is coupled to a second input terminal of the amplification circuit that receives the negative signal component of the differential clock signal.

9. A Universal Serial Bus (USB) integrated circuit (IC) controller, the USB IC controller comprising:
- a clock generation circuit configured to generate a differential clock signal; and
- a physical layer circuit comprising:
  - an amplification circuit configured to amplify the differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and
  - a duty cycle distortion correction circuit comprising:
    - a filter having a cutoff frequency below the frequency of the differential clock signal and configured to output a differential voltage that is proportional to a difference in duty cycle between the positive and negative signal components of the amplified differential clock signal;
    - a transconductance amplifier configured to convert the differential voltage to a differential current that is provided to the amplification circuit as feedback for reducing the duty cycle difference between the positive and negative signal components of the amplified differential clock signal; and
    - a common-mode loop comprising a PMOS transistor having a gate driven by a mid-rail voltage reference, wherein the common-mode loop is configured to force the average of a positive side of the differential voltage and a negative side of the differential voltage to half the mid-rail voltage reference.

10. The USB IC controller of claim 9, wherein the cutoff frequency of the filter is in a range of 100 to 200 times lower than the frequency of the differential clock signal.

11. The USB IC controller of claim 9, wherein the supply voltage for the amplification circuit is 1V or higher, and wherein the positive and negative signal components of the differential clock signal both have voltage swings in a range of 100 to 500 mV as input to the amplification circuit.

12. The USB IC controller of claim 9, wherein the duty cycle distortion correction circuit further comprises a common-mode loop configured to force an average duty cycle of both the positive and negative signal components of the amplified differential clock signal to 50%.

13. The USB IC controller of claim 9, wherein the filter comprises:
- a capacitor;
- a first resistor coupling a first terminal of the capacitor to a first buffer of the amplification circuit that outputs the positive signal component of the amplified differential clock signal; and
- a second resistor coupling a second terminal of the capacitor to a second buffer of the amplification circuit that outputs the negative signal component of the amplified differential clock signal.

14. The USB IC controller of claim 13, wherein the transconductance amplifier comprises:
- a first input terminal coupled to the first terminal of the capacitor of the filter;
- a second input terminal coupled to the second terminal of the capacitor of the filter;
- a first output terminal coupled to a first input terminal of the amplification circuit that receives the positive signal component of the differential clock signal; and
- a second output terminal coupled to a second input terminal of the amplification circuit that receives the negative signal component of the differential clock signal.

15. The USB IC controller of claim 9, wherein the transconductance amplifier comprises:
- a first PMOS transistor having a gate driven by the positive side of the differential voltage output by the filter; and
- a second PMOS transistor having a gate driven by the negative side of the differential voltage output by the filter.

16. The USB IC controller of claim 15, wherein a drain of the first PMOS transistor is coupled to a first input terminal of the amplification circuit that receives the positive signal component of the differential clock signal, and wherein a drain of the second PMOS transistor is coupled to a second input terminal of the amplification circuit that receives the negative signal component of the differential clock signal.

17. A clock signal conversion circuit, comprising:
- an amplification circuit configured to amplify a differential clock signal that has sub rail-to-rail voltage swings relative to a supply voltage for the amplification circuit, such that an amplified differential clock signal output by the amplification circuit has complementary positive and negative signal components with full rail-to-rail voltage swings relative to the supply voltage; and
- a duty cycle distortion correction circuit comprising:
  - a filter having a cutoff frequency below the frequency of the differential clock signal and configured to output a differential voltage that is proportional to a difference in duty cycle between the positive and negative signal components of the amplified differential clock signal;
  - a transconductance amplifier configured to convert the differential voltage to a differential current that is provided to the amplification circuit as feedback for reducing the duty cycle difference between the positive and negative signal components of the amplified differential clock signal; and
  - a common-mode loop comprising a PMOS transistor having a gate driven by a mid-rail voltage reference, wherein the common-mode loop is configured to force the average of a positive side of the differential voltage and a negative side of the differential voltage to half a mid-rail voltage reference input to the common-mode loop.

18. The clock signal conversion circuit of claim 17, wherein the transconductance amplifier comprises a first PMOS transistor having a gate driven by the positive side of the differential voltage output by the filter and a second PMOS transistor having a gate driven by the negative side of the differential voltage output by the filter, and wherein the common-mode loop comprises a PMOS transistor having a gate driven by the mid-rail voltage reference input to the common-mode loop.

* * * * *